(12) United States Patent
Qian et al.

(10) Patent No.: US 9,575,102 B2
(45) Date of Patent: Feb. 21, 2017

(54) DISPERSED STATE MONITORING DEVICE FOR DISTRIBUTED GENERATION

(71) Applicants: JINING POWER SUPPLY COMPANY OF STATE GRID SHANDONG ELECTRIC POWER COMPANY, JiNing, ShanDong Province (CN); STATE GRID CORPORATION OF CHINA, Beijing (CN)

(72) Inventors: Qinglin Qian, Jining (CN); Yanliang Wang, Jining (CN); Shuxi Xu, Jining (CN); Xiaohong Chen, Jining (CN); Lifeng Zhu, Jining (CN); Zongjie Liu, Jining (CN); Ping Kong, Jining (CN); Lei Xu, Jining (CN); Zijia Ding, Jining (CN); Yundong Xiao, Jining (CN); Bing Yuan, Jining (CN)

(73) Assignees: JINING POWER SUPPLY COMPANY OF STATE GRID SHANDONG ELECTRIC POWER COMPANY, Jining (CN); STATE GRID CORPORATION OF CHINA, Beijing (CN)

( * ) Notice: Subject to any disclaimer, the term of this patent is extended or adjusted under 35 U.S.C. 154(b) by 268 days.

(21) Appl. No.: 14/368,424

(22) PCT Filed: Dec. 17, 2012

(86) PCT No.: PCT/CN2012/001707
§ 371 (c)(1),
(2) Date: Jun. 24, 2014

(87) PCT Pub. No.: WO2014/043839
PCT Pub. Date: Mar. 27, 2014

(65) Prior Publication Data
US 2015/0028854 A1    Jan. 29, 2015

(30) Foreign Application Priority Data

Sep. 18, 2012   (CN) .......................... 2012 1 0344986

(51) Int. Cl.
*G01R 21/00*    (2006.01)
*G01R 21/133*   (2006.01)
(Continued)

(52) U.S. Cl.
CPC ......... *G01R 21/133* (2013.01); *G01R 19/2513* (2013.01); *G01R 21/006* (2013.01);
(Continued)

(58) Field of Classification Search
CPC . G01R 21/133; G01R 19/2513; G01R 22/063; G01R 21/006; G01R 21/06; G01R 31/42; G01R 1/203; G01R 15/146; G01R 19/0007
(Continued)

(56) References Cited

U.S. PATENT DOCUMENTS 5,278,512 A * 1/1994 Goldstein ............ G01R 31/025
324/509
2008/0234957 A1* 9/2008 Banhegyesi ........... G01D 4/004
702/64
(Continued)

FOREIGN PATENT DOCUMENTS

CN    102684554 A    9/2012
CN    102749593 A    10/2012
(Continued)

OTHER PUBLICATIONS

International Search Report issued in International Patent Application No. PCT/CN2012/001707 mailed Jun. 27, 2013.

*Primary Examiner* — Tung X Nguyen
*Assistant Examiner* — Robert P Alejnikov, Jr.

(74) *Attorney, Agent, or Firm* — Patrick A. Gildea

(57) ABSTRACT

A dispersed state monitoring device for distributed generation includes a power module, an input conditioning module, a data processing module and a network communication module which are connected one after another in this order. The power is input, via a civil plug and a 220V power socket, to the power module and the input conditioning module in the device at the same time. The power module ensures normal operation of the device through conditioning of a voltage. The input conditioning module is configured to condition input voltage signals, extract voltage transient-state and steady-state signals to be analyzed, and inputting the signals to the data processing module. The data processing module is configured to analyze the voltage transient-state and steady-state signals, judge the operating state of the distributed power source, and output a judging result to the network communication module. The result is output from the network communication module via a standard RJ45 Ethernet interface.

12 Claims, 2 Drawing Sheets

(51) Int. Cl.
*G01R 31/42* (2006.01)
*G01R 21/06* (2006.01)
*G01R 19/25* (2006.01)
*G01R 22/06* (2006.01)

(52) U.S. Cl.
CPC .............. *G01R 21/06* (2013.01); *G01R 31/42* (2013.01); *G01R 22/063* (2013.01)

(58) Field of Classification Search
USPC ...................................... 324/126, 113, 117 H
See application file for complete search history.

(56) References Cited

U.S. PATENT DOCUMENTS

| | | | | |
|---|---|---|---|---|
| 2010/0153752 A1* | 6/2010 | Tsukamoto | ............... | G06F 1/26 713/300 |
| 2010/0264733 A1* | 10/2010 | Arimilli | ............... | H05K 7/1492 307/31 |
| 2011/0199048 A1* | 8/2011 | Yokoyama | ............... | H02J 7/045 320/109 |
| 2011/0217615 A1* | 9/2011 | Smith | ............... | H01M 8/04223 429/452 |
| 2012/0016608 A1* | 1/2012 | Ko | ............... | G01D 4/002 702/62 |

FOREIGN PATENT DOCUMENTS

| | | |
|---|---|---|
| CN | 202548611 U | 11/2012 |
| JP | A-11-64417 | 3/1999 |
| JP | A-2009-178008 | 8/2009 |

* cited by examiner

DISPERSED STATE MONITORING DEVICE FOR DISTRIBUTED GENERATION

FIELD OF THE INVENTION

The invention relates to the field of power system state monitoring technology, in particular to a flexibly connectable dispersed state monitoring device for distributed generation.

BACKGROUND OF THE INVENTION

Currently, distributed green energy resources represented by wind power, photovoltaic and other new energy power generation modes are developing rapidly. Especially, with construction of power market, traditional power users, such as factory and mine enterprises and ordinary households, can sell electricity to the power grid and become small power producers when the power purchase price of the power grid is high, as long as they are equipped with distributed green energy resources. However, connection of such flexible distributed power sources to the power grid needs to be established on the basis of accurate real-time monitoring of the operating state of the power grid, to ensure impact on the distributed power sources themselves and the power grid when the distributed power sources are connected to the power grid.

Traditional power monitoring devices mainly include fixedly mounted electric meters, power analyzers, etc. mainly for monitoring users. There are also power monitoring systems for large users, etc. Such types of monitoring instruments have the following major shortcomings. First, monitoring is mostly unidirectional, so the instruments can not be effectively applied to a distributed generation system featured by dynamic conversion between power user/power producer roles. Second, such a device only performs monitoring of one node, without relevant data sharing and powerful data analysis, and thus the operating state level of a monitored point can only be simply analyzed. Overall evaluative analysis of the grid-connected system and the power supplied user can not be achieved.

To achieve the above objects, a monitoring system needs to meet the following conditions. First, coupling indices of the power system and distributed power interfaces are selected to effectively achieve two-way monitoring of power producer role conversion of distributed power sources. Second, the monitoring system must be full-distribution and centralized-type, to achieve local characteristic monitoring of the distributed power sources in a full-distribution manner, and achieve overall grid-connected characteristic analysis of the distributed power sources and the grid-connected power system by using global information in a centralized manner. In view of the above problems, the invention provides a flexibly connectable dispersed state monitoring device for distributed generation. The device is applied at a distributed power producer and is switched flexibly according to whether the distributed power source is connected to the grid. The device has a network communication function, providing data collection basis for centralized grid-connected analysis.

SUMMARY OF THE INVENTION

The object of the invention is providing a flexibly connectable dispersed state monitoring device for distributed generation to overcome shortcomings of the prior art. The device comprises a power module, an input conditioning module, a data processing module and a network communication module which are connected one after another in this order. The input of the device is only an ordinary civil plug. When the device is plugged in a 220V domestic power socket, power is input to the power module and the input conditioning module in the device at the same time. The power module ensures normal operation of the device through conditioning of a voltage. The input conditioning module is configured to condition input voltage signals, extract voltage transient-state and steady-state signals to be analyzed, and input the signals to the data processing module. The data processing module is configured to analyze the voltage transient-state and steady-state signals, judge the operating state of the distributed power source, and output a judging result to the network communication module. The result is output from the network communication module via a standard RJ45 Ethernet interface.

Due to adoption of the above technical solution, the device is compact and flexible, and can be used at any place with a power socket, to achieve plug and play. In application to a micro-grid with distributed generation, the device can achieve real-time monitoring of the distributed generation state.

DETAILED DESCRIPTION OF THE EMBODIMENTS

Figure 1:
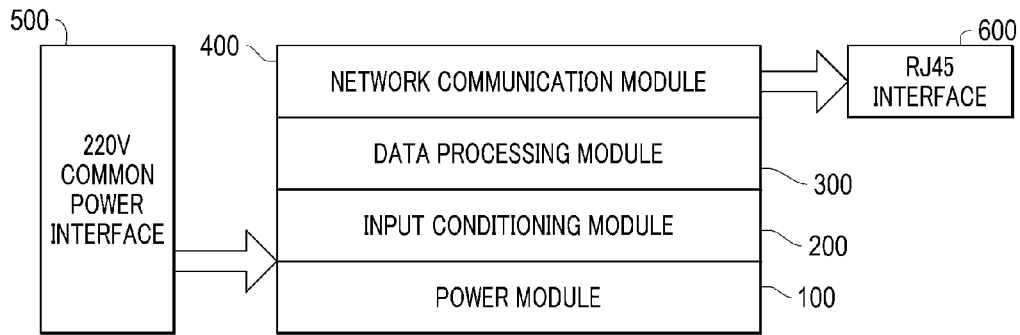
FIG. 1 is a block diagram of the configuration of an embodiment of the invention.

The specific embodiments of the invention are described below in conjunction with the accompanying drawings. As shown in FIG. 1, a dispersed state monitoring device 10 for distributed generation of an embodiment of the invention patent comprises a power module 100, an input conditioning module 200, a data processing module 300 and a network communication module 400 which are connected one after another in this order. The input 500 of the device 10 is only an ordinary civil plug. When the device 10 is plugged in a 220V domestic power socket, the power is input to the power module 100 and the input conditioning module 200 in the device 10 at the same time. The power module 100 ensures normal operation of the device 10 through conditioning of a voltage. The input conditioning module 200 is configured to condition input voltage signals, extract voltage transient-state and steady-state signals to be analyzed, and input the signals to the data processing module 300. The data processing module 300 is configured to analyze the voltage transient-state and steady-state signals, judge the operating state of the distributed power source, and output a judging result to the network communication module 400. Then the result is output from the network communication module 400 via a standard RJ45 Ethernet interface 600.

Figure 2:
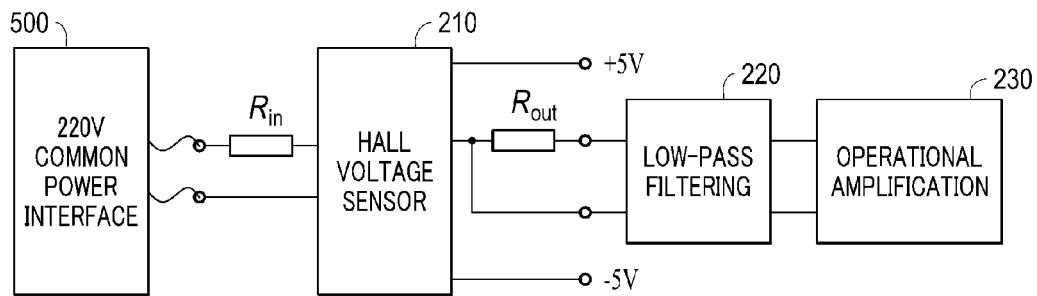
FIG. 2 is a block diagram of the configuration of an input conditioning module of an embodiment of the invention.

As shown in FIG. 2, while the input of the wall socket 500 is connected to the power module 100, the socket 500 is also connected to the input conditioning module 200, to achieve conversion of a phase voltage signal with a rated value of 220V to a voltage signal between −5V and +5V.

Figure 3:
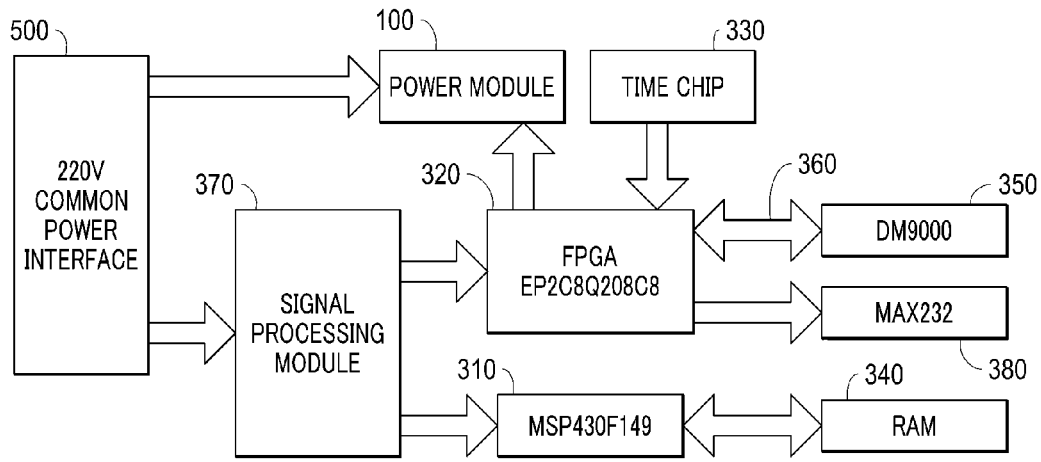
FIG. 3 is a block diagram of the configuration of data processing and network communication modules of an embodiment of the invention.
Figure 4:
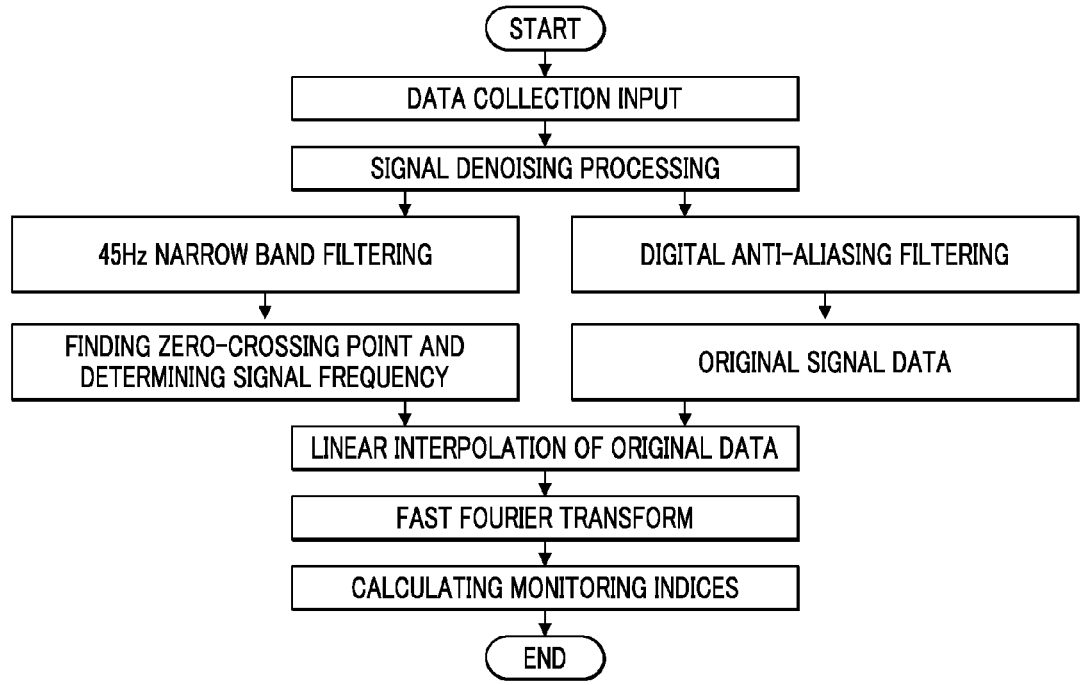
FIG. 4 is a software process of an embodiment of the invention.

As shown in FIG. 3, the data processing module 300 comprises singlechip 310 which may be a singlechip MSP430F149, an FPGA chip 320, which may be an FPGA EP2C8Q208C8 chip, a clock chip 330 and a synchronous dynamic random access memory 340 and a signal processing module 370. The synchronous dynamic random access memory 340, the singlechip 310 and the clock chip 330 are connected via an I/O expansion bus 360. An Ethernet communication controller 350 which may be a DM9000 controller is connected with the I/O expansion bus of the singlechip 310 at one end, and is connected with an RJ45 interface 600 at the other end, to receive fixed-value data from outside and send a processing result of the device. The software process in the singlechip is shown in FIG. 4.

Figure 5:
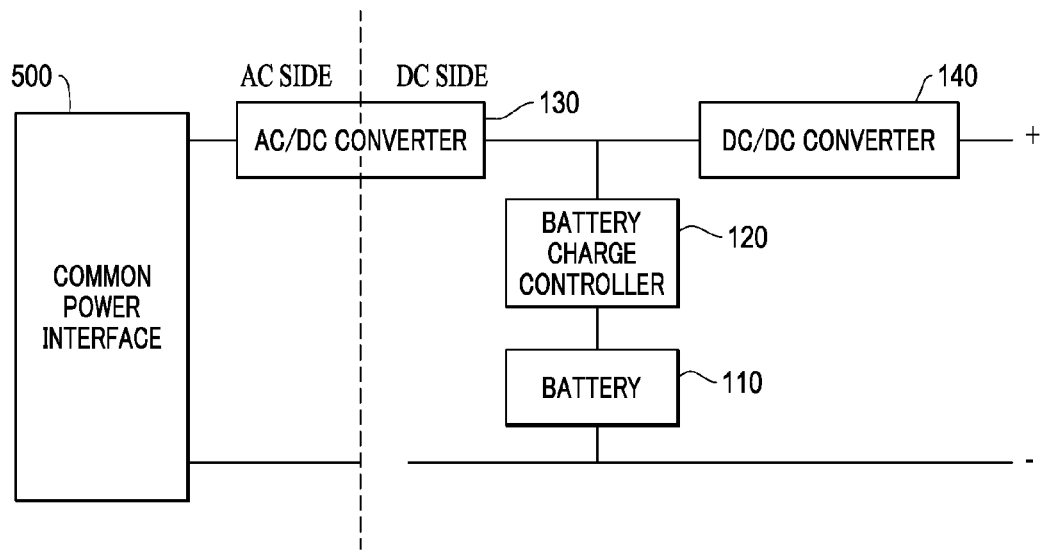
FIG. 5 is a block diagram of the power module of an embodiment of the invention.

As shown in FIG. 5, the power module 100 consists of a battery unit 110, a battery charge controller 120, an AC/DC conversion unit 130 and a DC/DC conversion unit 140. The input of the wall socket 500 is connected to an AC side of the AC/DC conversion unit 130. The battery unit 110 and the battery charge controller 120 are connected in series and then connected in parallel at a DC side of the AC/DC conversion unit 130. Meanwhile, the DC side of the AC/DC conversion unit 130 is connected with the DC/DC conversion unit 140, and the output of the DC/DC conversion unit 140 supplies power to other modules in the device.

1. Input Conditioning Module

The key technology of the input conditioning module is precise collection of 400V voltage signals. By adopting a Hall voltage sensor 210 based on Hall principle in the embodiment, the shortcoming that an electromagnetic transformer is only adapted to measure 50 Hz power frequency is overcome. Also, the input conditioning module 200 has the advantages that a voltage with any waveform can be measured, and transient peak parameters can be measured precisely. The precision is high, which exceeds 1% within the operating range, and the linearity exceeds 0.1%. The dynamic performance is good, and the response time is shorter than 1 μs. The working band is wide, and the module can work linearly within 0-100 kHz. The module has high overload capacity and high reliability, so explosion or overburning will not occur. The module is small in size, light in weight, easy to install, etc.

FIG. 2 is a block diagram of the configuration of the input conditioning module 200 of an embodiment of the invention, wherein the Hall voltage sensor 210 only needs to be externally connected to a positive and negative DC power source. The voltage-detected bus only needs to be connected to a primary side terminal, and then simple connection is made at a secondary side terminal to accomplish isolated detection of the main circuit and the control circuit. The circuit design is simple. At the same time, as the Hall sensor 210 is small in size and light in weight, it is also favorable for miniaturization of the monitoring device.

Output signals of the Hall voltage sensor 210 are sent to the signal conditioning circuit that includes a low-pass filter 220 and an operational amplifier 230 to achieve low-pass filtering and power amplification for preparation of data processing.

2. Data Processing and Network Communication Modules

The network communication module mainly achieves the two functions of serial communication and Ethernet communication, and either of the two communication modes can be used.

In consideration of the fact that the device needs to operate in a low power consumption state, an MSP430F149 chip is adopted as a master CPU for data processing, externally extended with a 256K RAM. An EP2C8Q208C8 chip is selected as an FPGA, to mainly implement driving and management of the Ethernet controller and internal sequential control of the data processing module. The Ethernet controller is a DM9000 chip, and serial communication is implemented by an RS232 communication interface externally extended for an Maxim232 chip 380, in order for field debugging. Main functions achieved by data processing include the following.

1) Real-time collection of voltage signals to be monitored by using the analog-digital (AD) conversion module inside the chip.

2) storage and analysis of the collected signals. Data are stored in the externally extended RAM. A data analysis flow diagram is shown in FIG. 4. First, voltage signals output from a 220V common power interface are collected via the input conditioning module. The signals are denoised and filtered, and then divided into two paths. In one path, signals are subjected to digital anti-aliasing filtering and then stored in an original data storage array. In the other path, signals are subjected to 45 Hz-55 Hz narrow-band filtering, and then zero crossing moments of the signals are extracted, and calculation is performed to obtain real-time frequencies of the input signals. According to the signal frequencies calculated in real time, the original data stored in the original data storage array is subjected to linear interpolation processing, and then full-cycle fast Fourier transform is performed, to obtain real-time amplitudes and phase angles of the signals. Then voltage transient-state and steady-state characteristic indices are calculated based on the calculated amplitudes and phase angles of the signals.

3) Detection and lockout alarming of the device, including real-time monitoring of power interruption, communication abnormality, and internal abnormality of the device, etc.

3. Power Module

In normal conditions, the power module is powered by a wall 220V AC power source. In the case of sudden poweroff, the monitoring system is further powered by a battery, and at the same time the monitoring instrument enters a low power consumption state, and only monitors and stores data, without performing external communication. Meanwhile, in order to ensure reliable operation of the monitoring instrument when the voltage drops, a bulk capacitor is added at the power inlet of the data processing module to support transient-state voltages. The power module consists of a battery unit, a battery charge controller, an AC/DC conversion unit and a DC/DC conversion unit. The input of the wall socket is connected to an AC side of the AC/DC conversion unit. The battery unit and the battery charge controller are connected in series and then connected in parallel at a DC side of the AC/DC conversion unit. Meanwhile, the DC side of the AC/DC conversion unit is connected with the DC/DC conversion unit, and the output of the DC/DC conversion unit supplies power to other modules in the device.

The invention has the following features and technical effects:

In view of flexible connection characteristic of the distributed power sources and the requirement of global optimization data analysis, the invention provides a flexibly connectable dispersed state monitoring device for distributed generation. The device collects power sources and power signals to be monitored by using a civil wall socket, has an Ethernet output of a standard specification, and can achieve multiple analytical functions of voltage transient-state and steady-state analysis, short-circuit fault analysis, harmonic content analysis, voltage fluctuation analysis, etc. of a micro-grid. The device is simple in structure and highly flexible in field application, and has low-power operation capacity and low cost.

The invention claimed is:

1. A dispersed state monitoring device for distributed generation, comprising a power module, an input conditioning module, a data processing module and a network communication module which are connected one after another in this order,
wherein the device only receives input from an ordinary civil plug, and when the device is plugged in a 220V domestic power socket, power is input to the power module and the input conditioning module in the device at the same time;
the power module ensures normal operation of the device through conditioning of a voltage of the input power;
the input conditioning module is configured to condition input voltage signals, extract voltage transient-state and steady-state signals to be analyzed, and input the signals to the data processing module;
the data processing module is configured to analyze voltage transient-state and steady-state signals, judge the operating state of the distributed power source, and output a judging result to the network communication module; and
the network communication module outputs the result via a standard RJ45 Ethernet interface.

2. The device of claim 1, wherein while the input of the wall socket is connected to the power module, the socket is also connected to the input conditioning module, to achieve conversion of a phase voltage signal with a rated value of 220V to a voltage signal between −5V and +5V.

3. The device of claim 1, wherein the data processing module comprises a singlechip MSP430F149, a clock chip and a synchronous dynamic random access memory, wherein the synchronous dynamic random access memory, the MSP430F149 and the clock chip are connected via an I/O expansion bus.

4. The device of claim 1, wherein the network communication module consists of an Ethernet communication controller DM9000 and an RJ45 interface; the DM9000 is connected with the I/O expansion bus of the singlechip MSP430F149 at one end, and is connected with the RJ45 interface at the other end, to receive fixed-value data from outside and send a processing result of the device.

5. A dispersed state monitoring device for distributed generation, comprising a power module, an input conditioning module, a data processing module and a network communication module which are connected one after another in this order,
wherein the device only receives input from an ordinary civil plug, and when the device is plugged in a 220V domestic power socket, power is input to the power module and the input conditioning module in the device at the same time;
the power module ensures normal operation of the device through conditioning of a voltage of the input power, the power module comprising a battery unit, a battery charge controller, an AC/DC conversion unit and a DC/DC conversion unit, the input of the wall socket being connected to an AC side of the AC/DC conversion unit, the battery unit and the battery charge controller being connected in series and then connected in parallel at a DC side of the AC/DC conversion unit;
the input conditioning module is configured to condition input voltage signals, extract voltage transient-state and steady-state signals to be analyzed, and input the signals to the data processing module;
the data processing module is configured to analyze voltage transient-state and steady-state signals, judge the operating state of the distributed power source, and output a judging result to the network communication module; and
the network communication module outputs the result via a standard RJ45 Ethernet interface.

6. The device of claim 5, wherein while the input of the wall socket is connected to the power module, the socket is also connected to the input conditioning module, to achieve conversion of a phase voltage signal with a rated value of 220V to a voltage signal between −5V and +5V.

7. The device of claim 5, wherein the data processing module comprises a singlechip MSP430F149, a clock chip and a synchronous dynamic random access memory, wherein the synchronous dynamic random access memory, the MSP430F149 and the clock chip are connected via an I/O expansion bus.

8. The device of claim 5, wherein the network communication module consists of an Ethernet communication controller DM9000 and an RJ45 interface; the DM9000 is connected with the I/O expansion bus of the singlechip MSP430F149 at one end, and is connected with the RJ45 interface at the other end, to receive fixed-value data from outside and send a processing result of the device.

9. A dispersed state monitoring device for distributed generation, comprising a power module, an input conditioning module, a data processing module and a network communication module which are connected one after another in this order,
wherein the device only receives input from an ordinary civil plug, and when the device is plugged in a 220V domestic power socket, power is input to the power module and the input conditioning module in the device at the same time;
the power module ensures normal operation of the device through conditioning of a voltage of the input power, the power module comprising a battery unit, a battery charge controller, an AC/DC conversion unit and a DC/DC conversion unit, the input of the wall socket being connected to an AC side of the AC/DC conversion unit, the battery unit and the battery charge controller being connected in series and then connected in parallel at a DC side of the AC/DC conversion unit, the DC side of the AC/DC conversion unit being connected with the DC/DC conversion unit, and the output of the DC/DC conversion unit supplying power to the input conditioning module;
the input conditioning module is configured to condition input voltage signals, extract voltage transient-state and steady-state signals to be analyzed, and input the signals to the data processing module;
the data processing module is configured to analyze voltage transient-state and steady-state signals, judge the operating state of the distributed power source, and output a judging result to the network communication module; and
the network communication module outputs the result via a standard RJ45 Ethernet interface.

10. The device of claim 9, wherein while the input of the wall socket is connected to the power module, the socket is also connected to the input conditioning module, to achieve conversion of a phase voltage signal with a rated value of 220V to a voltage signal between −5V and +5V.

11. The device of claim 9, wherein the data processing module comprises a singlechip MSP430F149, a clock chip and a synchronous dynamic random access memory, wherein the synchronous dynamic random access memory, the MSP430F149 and the clock chip are connected via an I/O expansion bus.

12. The device of claim 9, wherein the network communication module consists of an Ethernet communication controller DM9000 and an RJ45 interface; the DM9000 is connected with the I/O expansion bus of the singlechip MSP430F149 at one end, and is connected with the RJ45 interface at the other end, to receive fixed-value data from outside and send a processing result of the device.

* * * * *